United States Patent [19]
Nara et al.

[11] Patent Number: 5,398,047
[45] Date of Patent: Mar. 14, 1995

[54] SEMICONDUCTOR INTEGRATED CIRCUIT DEVICE INCLUDING HIGH-SPEED OPERATING CIRCUIT AND LOW-SPEED OPERATING CIRCUIT, AND SYSTEM USING THE SAME

[75] Inventors: Takashi Nara, Takasaki; Yasuhiro Kanzawa, Maebashi; Akira Uragami; Masaou Takahashi, both of Takasaki, all of Japan

[73] Assignees: Hitachi, Ltd.; Hitachi Microcomputer Engineering Ltd., both of Tokyo, Japan

[21] Appl. No.: 112,982

[22] Filed: Aug. 30, 1993

Related U.S. Application Data

[63] Continuation of Ser. No. 815,861, Jan. 2, 1992, abandoned, which is a continuation of Ser. No. 346,810, May 3, 1989, abandoned.

[30] Foreign Application Priority Data

May 11, 1988 [JP] Japan ................. 63-115183

[51] Int. Cl.⁶ .............................................. G09G 5/18
[52] U.S. Cl. ............................ 345/190; 345/200; 345/199; 365/230.05
[58] Field of Search ............... 345/185, 189, 190, 192, 345/193, 199, 200, 204, 205, 206; 365/177, 201, 230.05; 371/22.5

[56] References Cited

U.S. PATENT DOCUMENTS

| | | |
|---|---|---|
| 3,700,915 | 10/1972 | Marley . |
| 4,335,449 | 6/1982 | Nokubo .................. 365/177 |
| 4,357,703 | 11/1982 | Van Brunt .................. 371/22.5 |
| 4,541,076 | 9/1985 | Bowers et al. .............. 365/230.05 |
| 4,713,796 | 12/1987 | Ogiue et al. .............. 365/177 X |
| 4,779,230 | 10/1988 | McLaughlin et al. ........ 365/177 X |

FOREIGN PATENT DOCUMENTS

| | | |
|---|---|---|
| 0125504 | 11/1984 | European Pat. Off. . |
| 0137318 | 4/1985 | European Pat. Off. . |
| 0166966 | 1/1986 | European Pat. Off. . |
| 3504930 | 8/1985 | Germany . |
| 58-172021 | 10/1983 | Japan . |
| 62-169520 | 7/1987 | Japan . |
| 63-263918 | 10/1988 | Japan . |

*Primary Examiner*—Richard Hjerpe
*Attorney, Agent, or Firm*—Antonelli, Terry, Stout & Kraus

[57] ABSTRACT

The semiconductor integrated circuit device formed on one semiconductor substrate employs a plurality of first and second circuit blocks constituting functions of the same kind. The first and second circuit blocks, however, are implemented with respectively different types of circuits. The type of circuit employed in the respective first and second circuit blocks is necessarily consistent with the particular operation speed requirements thereof, such as, in connection with high-speed and low-speed circuit requirements for writing into the memory of a display system.

31 Claims, 11 Drawing Sheets

(Bi-CMOS)

(ECL)

(CMOS)

(TTL)

BCL (Bi-CMOS)

SEMICONDUCTOR INTEGRATED CIRCUIT DEVICE INCLUDING HIGH-SPEED OPERATING CIRCUIT AND LOW-SPEED OPERATING CIRCUIT, AND SYSTEM USING THE SAME

This application is a continuation of application Ser. No. 07/815,861, filed Jan. 2, 1992, now abandoned, which is a continuation of application Ser. No. 07/345,810, filed May 3, 1989, now abandoned.

BACKGROUND OF THE INVENTION

The present invention relates to a semiconductor integrated circuit device having a plurality of operating speeds and a system using the device and, more particularly, to techniques effective when used in a multi-port memory used in an image processing technology and an image processing system using the same.

Generally speaking, the integrated circuit device for the digital signal processing is systematized according to its operating speeds. In case one system is to be prepared, its whole system is constructed by organically combining a variety of in-system integrated circuits having an identical operating speed.

In a multi-port random access; memory (which will be shortly referred to as the "multi-port" RAM), for example, a plurality of word lines and a plurality of data lines are connected with each memory cell so as to give one memory cell a plurality of input/output terminals (or I/O ports). In order to give a static memory cell two I/O ports, for example, two word lines and two pairs of complementary data lines are connected with one memory cell. In order to accomplish the write-in and read-out operations of each I/O port, moreover, two series of decoders and two series of read/write circuits are provided in a memory unit. These two series of decoders and read/write circuits are constructed to have a substantially equal operating speed. In other words, these two series of circuits are composed of CMOS (Complementary Metal Oxide Semiconductor) circuits.

In a color palette LSI (Large-scale Semiconductor Integrated circuit device) having a dual-port memory assembled therein, on the other hand, there are provided two products, one being composed of a CMOS circuit only whereas the other being composed of an ECL (Emitter Coupled Logic) circuit only. These two color palette LSIs are separately used according to the operating speeds of a system for processing an image to be formed.

SUMMARY OF THE INVENTION

Our investigation, however, has revealed that the aforementioned technologies have the following problems.

Specifically, the semiconductor integrated circuit device according to conventional or known prior art has been formed under the assumption that it is to be used under single-speed circumstances. Thus, such prior art has a problem that it cannot efficiently construct a system or device having a plurality of speed circumstances.

In the case of cathode ray tube controller (which will be shortly referred to as the "CRTC" or "CRT controller") using the multi-port RAM, for example, the read-out (or display) operation for displaying an image, which has been stored in the multi-port RAM, in a cathode ray tube (which will be shortly referred to as the "CRT") has to be accomplished at a high speed for synchronizations with the display speed of the CRT. However, the rewrite (or drawing) operation of an image, which is stored in the multi-port RAM, may be accomplished at a relatively low speed because it need not be synchronized with the display speed of the CRT. In this case, too, the multi-port RAM of the prior art is constructed in its entirety to conform to the maximum operating speed. In the multi-port RAM of the prior art, specifically, the circuit to be used for the read-out operations requiring a high speed and the circuit to be used for the rewrite operations, which do not always require a high speed, are commonly constructed of circuits suited for the high speed. As a result, in order to compensate the high speed, the multi-port RAM of the prior art is accompanied by a disadvantage of an increase in the power consumption and a reduction in the degree of integration.

As has also been revealed by our investigations, it is seldom that the necessity for the high-speed operation covers all the circuits of the system requiring the high-speed operation, and it is frequent that only major or partial circuits of the system can operate at a high speed.

An object of the present invention is to efficiently construct a semiconductor integrated circuit device having a plurality of speed circumstances and a system using the same.

The aforementioned and other objects and novel features of the present invention will become apparent from the following description and in view of the accompanying drawings.

A representative of the invention to be disclosed hereinafter will be summarized in the following.

Specifically, one semiconductor integrated circuit device comprises a plurality of first and second circuit blocks having functions of the same kind, and these circuit blocks are characterized as having different circuit types of construction between them.

According to the above-specified means, in the plural circuit having the functions of the same kind, the first circuit blocks, which are required to have high-speed operations, are made to have circuit structures suited for the high speed, whereas the second circuit blocks, which are not necessarily required to have the high-speed operations, are made to have circuit structures suited for a low power consumption and a high integration density.

As a result, a semiconductor integrated circuit device having the plural speed circumstances (requirements) and a system using the same are efficiently constructed.

DESCRIPTION OF THE PREFERRED EMBODIMENTS

Figure 1:
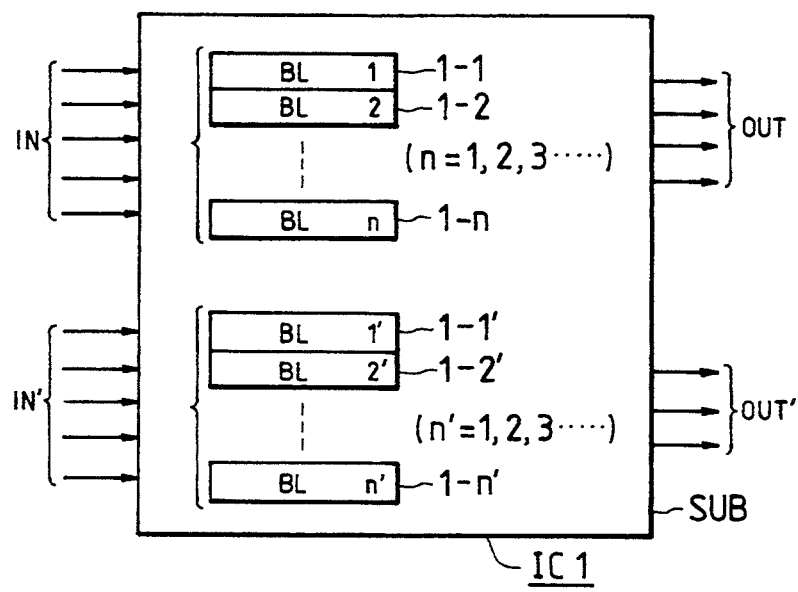
FIG. 1 is a diagram showing a schematic structure of a semiconductor integrated circuit device according to one embodiment of the present invention.
Figure 2:
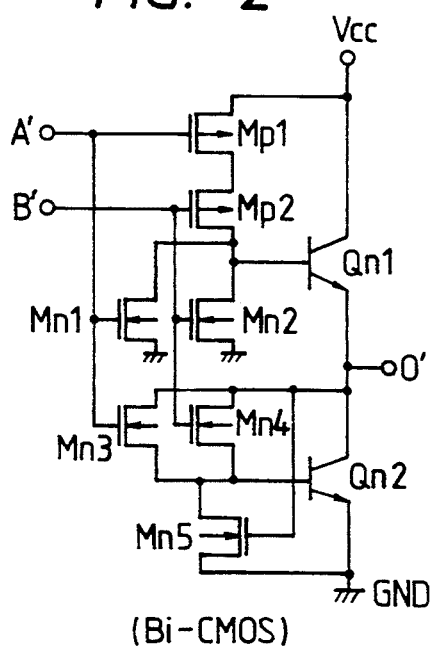
FIG. 2 is a diagram showing one example of the circuit structure of a circuit unit employed in conjunction with a circuit block having a low-speed requirement.

A preferred embodiment of the present invention will be described in the following discussion with reference to the accompanying drawings.

Here, identical reference characters will designate identical or corresponding portions.

FIG. 1 shows a schematic structure of a semiconductor integrated circuit device according to a first embodiment of the present invention.

A semiconductor integrated circuit device IC1, as shown in FIG. 1, is constructed such that an n-number of high-speed side circuit blocks 1-1 to 1-n (which will be shortly referred to as "first circuit blocks") having a circuit structure of ECL (Emitter Coupled Logic) type and an n'-number of low-speed side circuit blocks 1-1' to 1-n' (which will be shortly referred to as "second circuit blocks") having a circuit structure of Bi-CMOS (Bipolar Complementary Metal-Oxide Semiconductor) type are integrated in a common semiconductor substrate (SUB). Input signals IN and IN' are divided into those requiring high-speed processings and those not requiring high-speed processings and are inputted to the input terminals of each of the circuit blocks 1-1 to 1-n and 1-1' to 1-n'. The input signal IN requiring the high-speed processings are inputted to the high-speed side circuit blocks 1-1 to 1-n whereas the input signals IN' not requiring no high-speed operation are inputted to the low-speed side circuit blocks 1-1' to 1-n'. Moreover, output signals OUT having been processed at the high speed by the high-speed side circuit blocks 1-1 to 1-n and output signals OUT' having been processed at the low speed by the low-speed side circuit blocks 1-1' to 1-n' are provided to the outside from the respectively external terminals of the semiconductor substrate integrated circuit device IC1.

Here, the aforementioned two kinds of circuit blocks 1-1 to 1-n and 1-1' to 1-n' are deemed to have different circuit structures consistent with the requirements in their operating speeds but are to have identical or similar functions for their corresponding reference numerals.

The circuit unit used to compose the aforementioned low-speed side circuit blocks 1-1' to 1-n' is exemplified by a BCL (Bipolar CMOS composite logic) circuit. The BCL circuit, as shown, is also called the "Bi-CMOS" circuit and includes: an input logic unit which is constructed of a low power consumption type CMOS circuit composed of p-channel MOS transistors Mp1 and Mp2 and n-channel MOS transistors Mn1 to Mn5; and an output unit composed of NPN bipolar transistors Qn1 and Qn2 having a high current drivability and connected in the form of a totem pole between a supply voltage Vcc and the ground potential GND. The BCL circuit is inferior in relation to speed with respect to an ECL circuit, described below, but is far superior in the low power consumption and the propriety for high integration density. Here, the shown Bi-CMOS circuit forms a dual-input NOR circuit. The power source voltage Vcc and the ground potential GND are set at 5 V and 0 V, or 0 V and −5.2 V. Reference letters A' and B' designate logic inputs, and letter O' designates a logic output.

Figure 3:
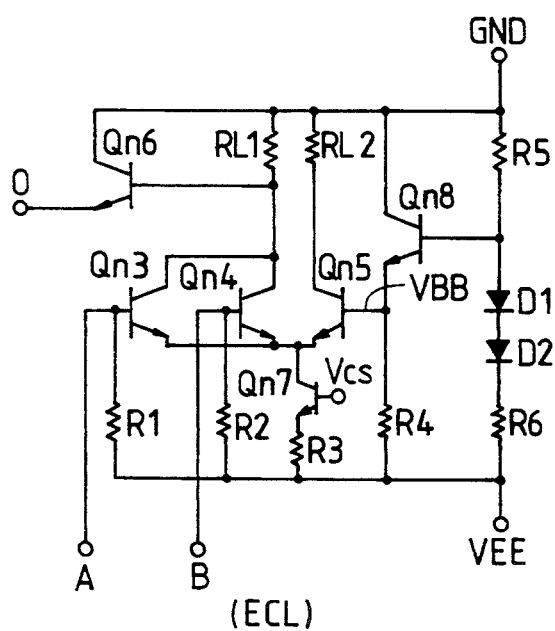
FIG. 3 is a diagram showing one example of the circuit structure of a circuit unit employed in conjunction with a circuit block having a high-speed requirement.

On the other hand, the circuit unit used to compose the aforementioned high-speed side circuit blocks 1-1 to 1-n is exemplified by an ECL (Emitter Coupled Logic) circuit, as shown in FIG. 3. The ECL circuit, as shown, is characterized as having high power consumption, because its current switching bipolar transistors Qn3 to Qn5 are operated in an unsaturated state while being supplied with a relatively high operating current, but can be operated at a remarkably high speed. Here, the ECL circuit, as shown, forms a dual-input NOR gate. Reference letters GND designate the ground potential (0 V) for providing a high-level reference, letters $V_{EE}$ designate a negative supply potential (−5.2 V). Letters A and B designate logic inputs, and letter O designates a logic output. Reference characters $R_{L1}$ and $R_{L2}$ designate load resistances; characters Qn6 an NPN type output bipolar transistor; characters Qn7 an NPN current supply bipolar transistor having its base receiving a reference potential Vcs; and characters R1, R2 and R3 resistances. There is further provided a circuit for generating a reference potential $V_{BB}$ which is composed of an NPN bipolar transistor Qn8, resistances R4 to R6, and diodes D1 and D2. Incidentally, a description of the operation of this ECL circuit will be omitted because it is well known in the art.

Figure 4:
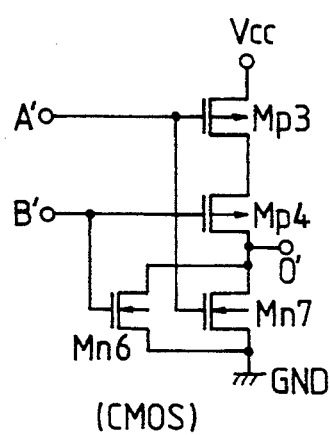
FIG. 4 is a diagram showing another example of the circuit structure of a circuit unit employed in conjunction with the circuit block having the low-speed requirement.
Figure 5:
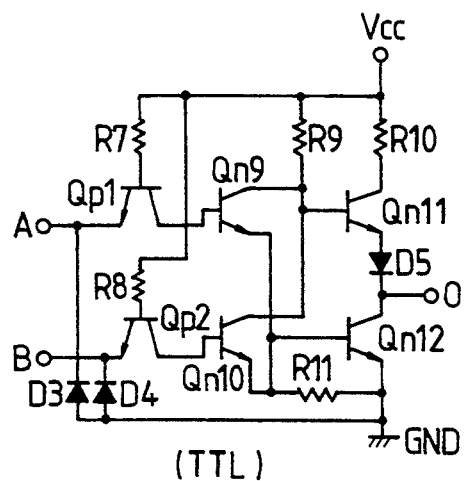
FIG. 5 is a diagram showing another example of the circuit structure of a circuit unit employed in conjunction with the circuit block having the high-speed requirement.

FIGS. 4 and 5 show other examples of the combination of the low-speed and high-speed side circuit blocks formed in the common semiconductor integrated circuit device.

Specifically, the circuit units composing the low-speed side circuit blocks 1-1' to 1-n' contain a pure CMOS logic circuit, as exemplified in FIG. 4. This pure CMOS logic circuit is formed into a dual-input NOR circuit composed of P-channel MOSFETs Mp3 and Mp4 and N-channel MOSFETs Mn6 and Mn7, as shown in FIG. 4. A description of the operation of this CMOS circuit will be omitted because it is well known in the art. On the other hand, the circuit units composing the aforementioned high-speed side circuit blocks 1-1 to 1-n contain a TTL circuit, as exemplified in FIG. 5. This TTL circuit is composed of PNP type input bipolar transistors Qp1 and Qp2, phase splitting npn bipolar transistors Qn9 and Qn10, output transistors Qn11 and Qn12, diodes D3 to D5, and resistances R7 to R11. Incidentally, a description of the operation of the TTL circuit will be omitted because it is well known in the art.

In the common semiconductor integrated circuit device, as has been described above, there are formed a plurality of circuit blocks having functions of the same kind, and the circuit units composing each circuit block have different circuit structures between the blocks. Specifically, the circuit block required to have high-speed operations is made to have a circuit structure suited for the high speed, where a side circuit block not necessarily required to have the high-speed operations is made to have a circuit structure suited for the low power consumption and the high integration.

Thus, it is possible to efficiently construct a system or apparatus having a plurality of speed circumstances and to optimize the structure of a system or apparatus required to have the high speed.

The description to be made in the following is directed to the case in which the present invention is applied to a color palette LSI.

With first reference to FIG. 6, there will be described an image processing system in which the color palette is assembled. This image processing system includes a microprocessor unit (which will be shortly referred to as "MPU") 6-5', a graphic controller 6-5a, a plurality of video memories or frame buffer memories 6-5b, a color palette or color lookup table CPLT and an analog color CRT display 6-8. The MPU 6-5' is coupled to the graphic controller 6-5a and the color palette CPLT through a/data bus DB and an address bus ADB to control the operations of the graphics controller 6-5a and the color palette CPLT.

The graphic controller 6-5a can be exemplified by a CRT controller having graphic drawing and displaying functions, such as raster scan type advanced CRT controller (which will be shortly referred to as the "ACRTC") HD63484 commercially available from Hitachi, Ltd. In case the image data stored already in the video memory 6-5b are to be displayed in the CRT display, the graphic controller 6-5a of the displaying operations produces a display address for accessing (for the displaying operations) the aforementioned video memory 6-5b in synchronism with the display timing of the CRT display. Moreover, in the case of the drawing operations for rewriting the image data stored already in the video memory 6-5b, the graphic controller 6-5a discriminates a drawing command fed from the MPU 6-5' to produce the drawing address for accessing (for the drawing operations) the video memory 6-5b. In this case of the drawing operations, the graphic controller 6-5b can execute both the reading operation of the image data, which are stored in the video memory 6-5b, and the writing operation of the image data to be written in the video memory 6-5b.

Moreover, the graphics controller 6-5a always produces a variety of displaying synchronizing signals such as a horizontal synchronizing signal (HSYNC) and a vertical synchronizing signal (VSYNC) (which will be shortly referred to as the "horizontal/vertical synchronizing signals ($\overline{SYNC}$)") and a display timing clock DISP (although not shown), all of which are required for displaying a drawing in the CRT display 6-8.

The aforementioned video memory 6-5b, for example, is constructed of two high-speed semiconductor memories of 64K words×4 bits. This video memory 6-5b outputs a pixel data of 8 bits in response to one display address fed from the aforementioned graphic controller 6-5a.

The color palette CPLT receives at its pixel data input terminals P0 to P7 the pixel data of 8 bits outputted from the video memory 6-5b, and outputs color data of the addresses corresponding to the pixel data of 8 bits from its analog color signal output terminals R, G and B. In other words, the video memory 6-5b stores as the pixel data the address data for accessing the memory array disposed in the aforementioned color palette CPLT. Since this color palette CPLT latches color data of $(2^8)=256$ words therein, as can be understood from the above, the CRT screen of the analog CRT display 6-8 can display 256 colors simultaneously. Each of the color data of 256 words is composed of digital color information of 12 bits containing red information of 4 bits, green information of 4 bits and blue information of 4 bits.

Thus, when the pixel data are inputted from the aforementioned video memory to the color palette CPLT, the digital color information of 12 bits stored at the address according to those pixel data is read out, and each piece of red, green and blue information of 4 bits is converted from the digital signal into an analog signal by a corresponding digital/analog converter in the color palette CPLT and is outputted from the corresponding one of the analog color signal output terminals R, G and B. Analog color signals AR, AG and AB of TTL levels thus outputted from the analog color signal output terminals R, G and B are fed to the CRT of the analog CRT display 6-8.

In case the display screen of the analog CRT display 6-8 contains four hundred scanning lines (or rasters) each composed of 640 dots, for example, the aforementioned color palette CPLT outputs the aforementioned analog color signals AR, AG and AB for the display of one dot of the aforementioned display screen. As a result, the outputting operations of the analog color signals AR, AG and AB of the color palette CPLT are synchronized with the display timing of the CRT display 6-8. Specifically, the aforementioned video memory 6-5b is display-accessed by the aforementioned graphic controller 6-5a in synchronism with the display timing of the CRT display 6-8 to feed the pixel data to the color palette CPLT in synchronism with the aforementioned display timing. Moreover, the color palette CPLT feeds the aforementioned analog color signals AR, AG and AB to the aforementioned display 6-8 in synchronism with the display timing.

In case the horizontal display time and vertical display time of the analog CRT display 6-8 are set at 30.4 μs and 16.11 ms, respectively, the display time of one dot is calculated by 30.4 μs÷640 dots=47.5 ns=21.05 MHz so that a dot clock of 21.05 MHz is inputted to a dot clock terminal DOTCK of the color palette CPLT from a not-shown oscillator. Moreover, the horizontal/vertical synchronizing signals $\overline{SYNC}$ outputted from the graphic controller 6-5a are fed to the synchronizing signal terminal $\overline{SYNC}$ of the color palette CPLT. As a result, the aforementioned analog color signals AR, AG and AB are fed to the CRT display 6-8 in synchronism with the aforementioned synchronizing signals $\overline{SYNC}$ and dot clock. The display access operating speed of the color palette CPTL is set at 80 to 150 MHz, for example.

On the other hand, the color palette CPTL can convert the digital color information, which is stored therein, in response to a command coming from the MPU 6-5'. Specifically, the color palette CPLT stores the information of 256 colors, as has been described hereinbefore, which is selected from 4,096 colors ($=2^{12}$) by the MPU 6-5'. Therefore, the MPU 6-5' executes, if necessary, the rewrite of the digital color information of 12 bits in the color palette CPLT. The changing operation of the aforementioned color information need not be synchronized with the display time of the CRT display 6-8 but may be synchronized with the operating speed of the MPU 6-5' such as 1 to 10 MHz. This color information rewriting operation is executed by receiving, at its external terminals RS0, RS1, $\overline{WR}$, $\overline{RD}$, $\overline{CS}$ and DO to D7, respectively, not only the register selection signal, the read control signal, the write control signal, the chip select signal fed from the MPU 6-5' but also the rewrite address and the rewrite color data fed through the data bus DB.

Figure 6:
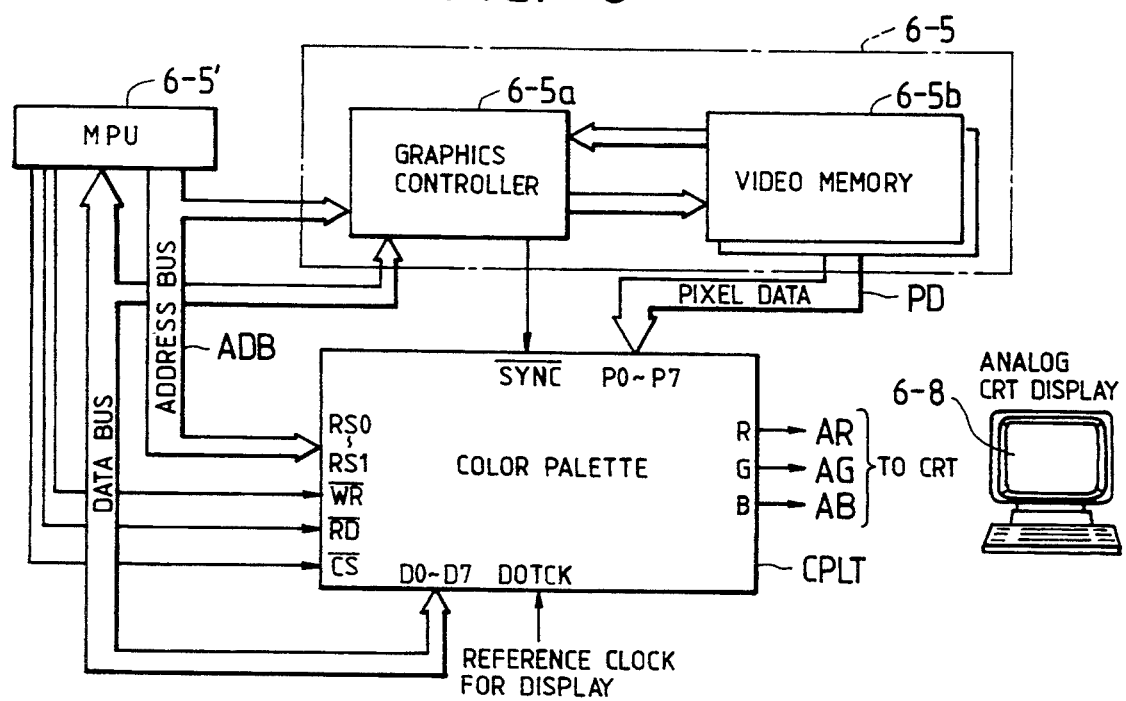
FIG. 6 is a diagram showing a schematic structure of an image processing system using a color palette CPLT according to the present invention.

In the image (or graphic) processing system shown in FIG. 6, as has been described from the description thus far described, the MPU 6-5' is used as the low-speed external operating system, and the aforementioned graphics controller 6-5a and video memory 6-5b are used as the high-speed external operating system 6-5.

Figure 7:
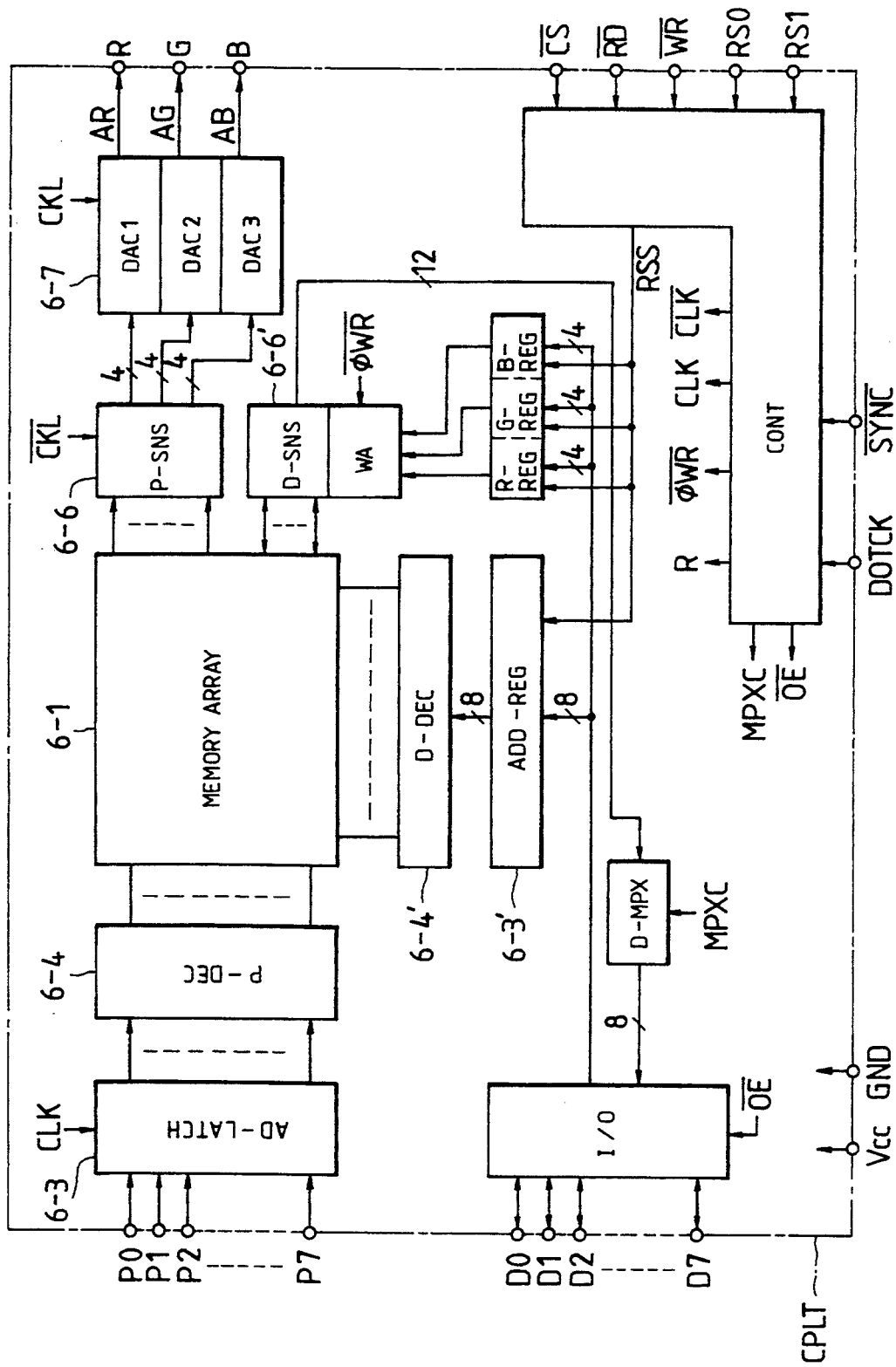
FIG. 7 is a block diagram showing the color palette according to the present invention.

FIG. 7 is a block diagram showing the color palette CPLT shown in FIG. 6.

The color palette CPLT includes the memory array 6-1 for storing the digital color information. This memory array 6-1 contains a dual-port memory cells of 256 words×12 bits and can be accessed by both: a pixel data decoder (P-DCE) 6-4 for decoding the output signal of an address latch circuit (AD-LATCH) 6-3, which is made operative to latch the pixel data of 8 bits fed from the pixel data input terminals P0 to P7 in synchronism with the clock signal (CLK), to select a plurality of (twelve) memory cells according to the aforementioned pixel data; and a rewrite address decode circuit D-DEC 6-4' for decoding the rewrite address of 8 bits, which is fed from the data input/output terminals D0 to D7 through an input/output buffer I/O to the address register 6-3', to select a plurality of (twelve) memory cells according to the aforementioned rewrite address.

The digital color data, which have been stored in the plural memory cells selected by the aforementioned pixel data decoder 6-4, are read out by the sense circuit P-SNS 6-6 and latched by a latch circuit of the sense circuit R-SNS 6-6 in synchronism with the clock signal $\overline{CLK}$. Then, the color data thus latched are fed four bits by four bits to the respective input terminals of digital-/analog converters (DAC1, DAC2 and DAC3) 6-7 so that they are converted to the analog color signals AR, AB and AG until they are fed to the analog color signal output terminals R, G and B in synchronism with the clock signal CLK.

On the other hand, the data can be written in and read out from the twelve memory cells which are selected by the decoder circuit D-DEC 6-4'. In the case of the data writing (or rewriting) operations, the color data to be written in the memory cells are outputted from the MPU 6-5' and are stored four bits by four bits in each of registers R-REG, G-REG and B-REG through the external terminals D0 to D7 and the aforementioned input/output buffer I/O. After this, the data latched in the registers R-, G- and B-REG are written in the memory cells in the selected state by a write amplifier WA which is activated in response to the low level of a write pulse signal $\overline{\phi_{WR}}$. In the case of the data reading operations, on the other hand, the data stored in the selected memory cells are amplified by the sense amplifier D-SNS 6-6' and are fed through the data multiplexer D-MPX and the input/output buffer I/O to the data input/output terminals D0 to D7.

In response to a chip select signal $\overline{CS}$, a read control signal $\overline{RD}$, a write control signal $\overline{WR}$ and register selection signals RS0 and RS2, a control circuit CONT produces an internal register selection signal Rss, an internal read control signal R, a multiplexer control signal MPXC, an output enable signal $\overline{OE}$ and a write pulse $\overline{\phi_{WR}}$. In response to a dot clock DOTCK and the synchronizing signal $\overline{SYNC}$, the control circuit CONT further produces the internal clock signals CLK and $\overline{CLK}$.

The aforementioned data multiplexer D-MPX responds to the high level of the multiplexer control signal MPXC to share the data of 12 bits fed into three of four bits, for example, and to feed it to the input/output buffer I/O.

This input/output buffer I/O is used as an output buffer in response to the low level of the output enable signal $\overline{OE}$ and as an input buffer circuit in response to the high level of the output enable signal $\overline{OE}$.

The aforementioned internal register selection signal RSS is used as the register selection signal for the aforementioned address register (ADD-REG) 6-3' and the aforementioned rewrite data registers R-, G- and B-REG. If the rewrite address signal is inputted from the input/output buffer I/O, the address register (ADD-REG) 6-3' is brought into the selection state by the internal register selection signal RSS. If the color data R, G and B to be rewritten are fed in a time-shared manner of 4 bits from the input/output buffer I/O, the three rewrite data registers R-REG, G-REG and B-REG are sequentially selected by the internal register selection signal RSS so that the desired color data are latched in those data registers R-, G- and B-REG.

Figure 8:
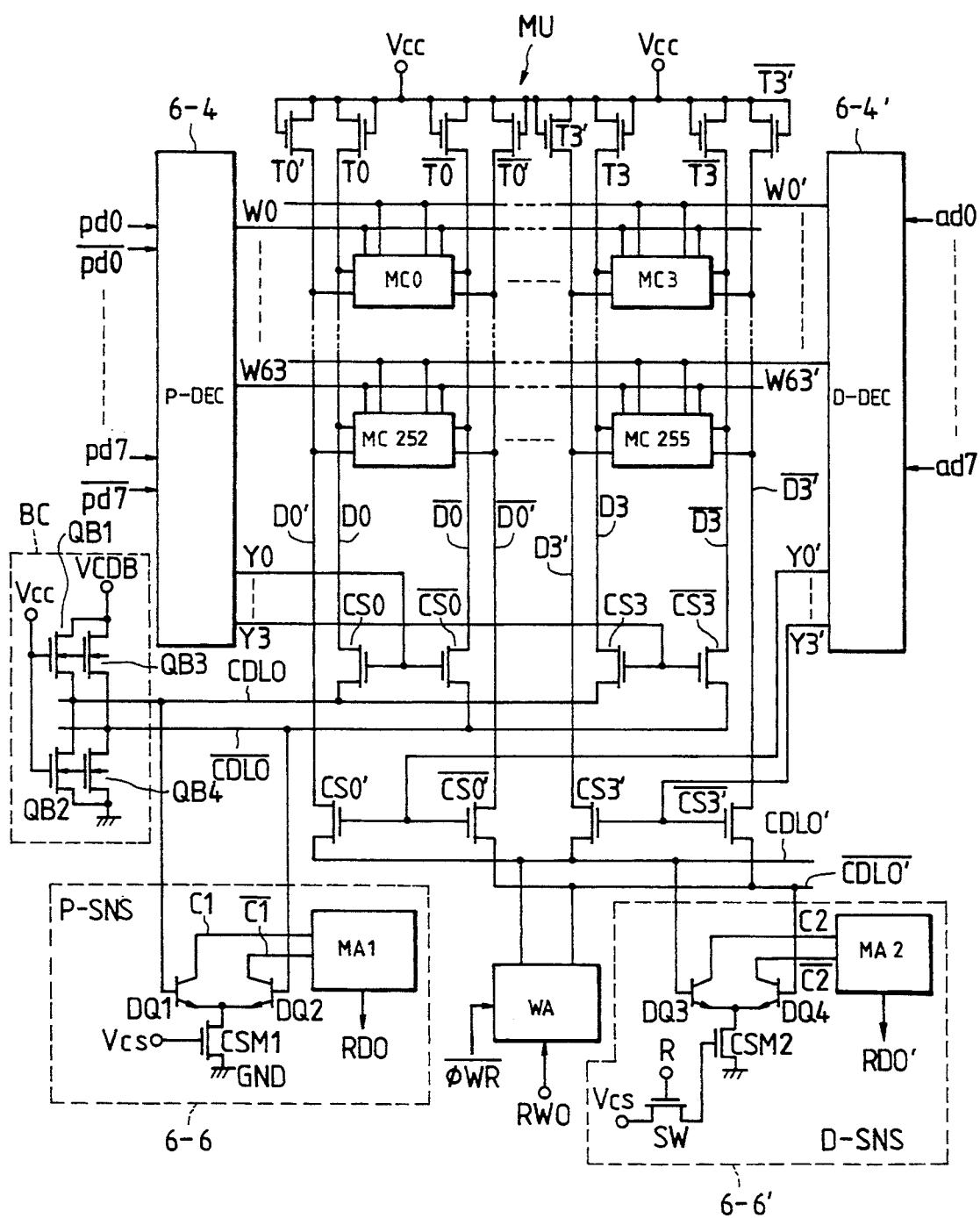
FIG. 8 is a diagram showing a memory array and an external circuit of the color palette of the present invention.

FIG. 8 shows a portion of the memory array 6-1, the pixel data decorder 6-4, a rewrite address decoder 6-4', the sense circuits (P-SNS and D-SNS) 6-6 and 6-6' and a write amplifier WA, as shown in FIG. 7. Here, FIG. 8 shows the portion corresponding to one bit of the color data of 12 bits. It should be noted that the portion excepting the decoders 6-4 and 6-4' is present in 11 sets.

One memory unit MU includes 256 memory cells $MC_0$ to $MC_{255}$, word lines W0 to W63 and W0' to W63' and paired complementary data lines D0, $\overline{D0}$, D0' and $\overline{D0'}$ to D3, $\overline{D3}$, D3' and $\overline{D3'}$. Each memory cell is coupled to two word lines and two pairs of complementary data lines so that it is used as a dual-port memory cell.

For example, the memory cell $MC_0$ is coupled to: the first word line W0 which in turn is coupled to the pixel data decoder 6-4; the second word line W0' which in turn is coupled to the rewrite=address decoder 6-4'; the first pair of complementary data lines D0 and $\overline{D0}$ and the second pair of complementary data lines D0' and $\overline{D0'}$. The other memory cells are likewise coupled to the corresponding first and second word lines and first and second pair of complementary data lines.

N-channel load MOSFETs T0, $\overline{T0}$, T0' and $\overline{T0'}$ to T3, $\overline{T3}$, T3' and $\overline{T3'}$ have their individual source-drain paths coupled between the corresponding paired data lines D0, $\overline{D0}$, D0' and $\overline{D0'}$ to D3, $\overline{D3}$, D3' and $\overline{D3'}$ and the supply voltage (i.e., the first operating voltage) of the circuit and their individual gates coupled to the aforementioned terminal Vcc to bias the corresponding complementary data lines.

A first pair of common data lines CDL0 and $\overline{CDL0}$ are coupled to the aforementioned first pair of complementary data lines D0 and $\overline{D0}$ to D3 and $\overline{D3}$ through the source-drain paths of paired column switching N-channel MOSFETs CS0 and $\overline{CS0}$ to CS3 and $\overline{CS3}$.

Second pair of common data lines CDL0' and $\overline{CDL0'}$ are coupled to the aforementioned second pair of complementary data lines D0' and $\overline{D0'}$ to D3' and $\overline{D3'}$ through the source-drain paths of paired column switching N-channel, MOSFETs CS0' and $\overline{CS0'}$ to CS3' and $\overline{CS3'}$.

The first sense amplifier (P-SNS) 6-6 is composed of: a pair of differential NPN bipolar transistors DQ1 and DQ2 having their individual base electrodes coupled to the corresponding first pair of common data lines CDL0 and $\overline{CDL0}$ and their individual emitter electrodes coupled commonly; a current source MOSFET CSM1 for supplying its operating current to the aforementioned differential bipolar transistors DQ1 and DQ2; and a main amplifier MA1 coupled to the collectors of the differential bipolar transistors DQ1 and DQ2. The current source MOSFET CSM1 has its source-drain path coupled between the common emitter of the bipolar transistors DQ1 and DQ2 and the GND terminal fed with the ground potential (i.e., the second operating voltage) of the circuit and its gate electrode supplied with the voltage Vcs for turning the MOSFET CSM1 on at all times. As a result, the first sense amplifier (P-SNS) 6-6 is always held in its operating speed to make the high-speed read possible.

A bias circuit BC is coupled to the first pair of common data lines CDL0 and $\overline{CDL0}$ to bias it to a predetermined potential at all times thereby to make the high-speed read possible. The bias circuit BC is composed of N-channel MOSFETs QB1, QB2, QB3 and QB4 having their individual gate electrodes connected with the Vcc terminal. Each of the MOSFETs QB1 and QB3 is connected between a terminal $V_{CDB}$ to be fed with the common data line bias potential and the corresponding first pair of common data lines CDL0 and $\overline{CDL0}$, and each of the MOSFETs QB2 and QB4 is connected between the corresponding first pair of common data lines CDL0 and $\overline{CDL0}$ and the ground terminal GND. The common data line potential to be fed to the terminal $V_{CDB}$ is determined to be a lower level than the individual collector potentials of the differential bipolar transistors when the potential of the first pair of common data lines CDL0 and $\overline{CDL0}$ to be biased by the aforementioned bias circuit BC, i.e., the base potential of the differential bipolar transistors DQ1 and DQ2' is in the standby state. As a result, the differential bipolar transistors DQ1 and DQ2 are devised not so as to be saturated.

Like the first sense amplifier 6-6, the second sense amplifier 6-6' contains the differential NPN bipolar transistors DQ3 and DQ4, a current source N-channel MOSFET CSM2 and a main amplifier MA2. The difference from the first sense amplifier 6-6 resides in that there is provided a switch N-channel MOSFET SW which has a source-drain path connected between the Vcs terminal and the gate electrode of the current source MOSFET CSM2 and a gate electrode connected to receive the aforementioned internal read control signal R. As a result, the second sense amplifier 6-6' is brought into an operating state, only during a read period for which the internal read control signal R is at the high level, to prevent the increase in the power consumption.

In case the data stored in the memory cell according to the pixel data are to be read out, the aforementioned pixel data decoder (P-DEC) 6-4 decodes the internal complementary address signals pd0 and $\overline{pd0}$ to pd7 and $\overline{pd7}$, which are fed from the address latch circuit (ADD-LATCH) 6-3 to set one of the first word lines W0 to W63, e.g., the word line W0 to the selection level and one of first column selection lines Y0 to Y3, e.g., the column selection line Y0 to the selection level. In accordance with the selection level of the word line W0, the memory cell $MC_0$ is brought into the selection state so that the potentials of the first complementary data lines D0 and $\overline{D0}$ are changed to correspond to the data stored in the memory cell $MC_0$. In accordance with the selection level of the column selection line Y0, on the other hand, the column switches MOSFETs CS0 and $\overline{CS0}$ are turned on so that the potential fluctuations of the first complementary data lines D0 and $\overline{D0}$ are transmitted to the first pair of common data lines CDL0 and $\overline{CDL0}$. As a result, the aforementioned differential bipolar transistors DQ1 and DQ2 detect the potential changes of the base electrodes thereof to feed the detected outputs to the main amplifier MA1. This main amplifier MA1 has its output fed with a read data RD0 corresponding to the data which are stored in the aforementioned memory cell $MC_0$.

In case, on the other hand, a memory cell according to the address signal latched in the address register (ADD-REG) 6-3' is to be selected, the aforementioned address decoder (D-DEC) brings the memory cell $MC_3$ into the selection state by decoding internal address signals ad0 to ad7 fed from the address registers 6-3' and by setting one of the second word lines, e.g., the second word line W0' and one of the second column selection lines Y0' to Y3", e.g., the second column selection line Y3', in accordance with the internal address signals ad0 to ad7 to their respective selection levels. In case data are to be read out from the memory cell $MC_3$ in the selection state, the data of the memory cell $MC_3$ are transmitted to the bases of the differential bipolar transistors DQ3 and DQ4 through the second pair of complementary data lines D3' and $\overline{D3'}$, the source/drain paths of the column switch MOSFETs CS3' and $\overline{CS3'}$ in the ON state and the second pair of common data lines CDL0' and $\overline{CDL0'}$. In the case of the reading operations, the internal read control signal R at the high level is fed to the gate of the aforementioned switch MOSFET SW so that a current source MOSFET CSM2 is set in the on state to supply the operating current to the differential bipolar transistors DQ3 and DQ4. As a result, the aforementioned differential bipolar transistors DQ3 and DQ4 detect the potential changes at their bases to feed the detected outputs to the input of the main amplifier MA2. In response to the detected outputs, the main amplifier MA2 feeds from its output the read data RD0' corresponding to that stored in the aforementioned memory cell MC3. In case, on the other hand, the data of the memory cell MC3 in the selection state is to be rewritten, the data RW0 to be stored in the memory cell MC3 is transmitted to the second pair of common data lines CDL0' and $\overline{\text{CDL0}}'$ by the write amplifier WA activated by the aforementioned write pulse $\phi_{WR}$. As a result, the potentials at the second pair of common data lines CDL0' and $\overline{\text{CDL0}}'$ are set at the high and low levels or at the low and high levels in response to the data RW0. The potential difference between the second pair of common data lines CDL0' and $\overline{\text{CDL0}}'$ is transmitted to the memory cell MC3 through the source-drain paths of the aforementioned column switch MOSFETs CS3' and $\overline{\text{CS3}}'$ and the second pair of complementary data lines D3' and $\overline{\text{D3}}'$. As a result, the data corresponding to the data RW0 is stored in the memory cell MC3. In other words, the data of the memory cell MC3 is rewritten.

Figure 9A:
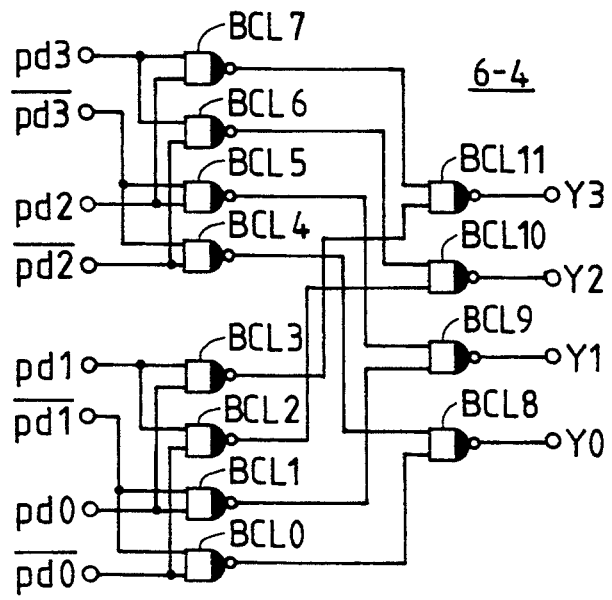
FIG. 9(A) is a diagram showing a portion of an example of the structure of a high-speed side decoder formed in the semiconductor integrated circuit device of FIG. 8.
Figure 9B:
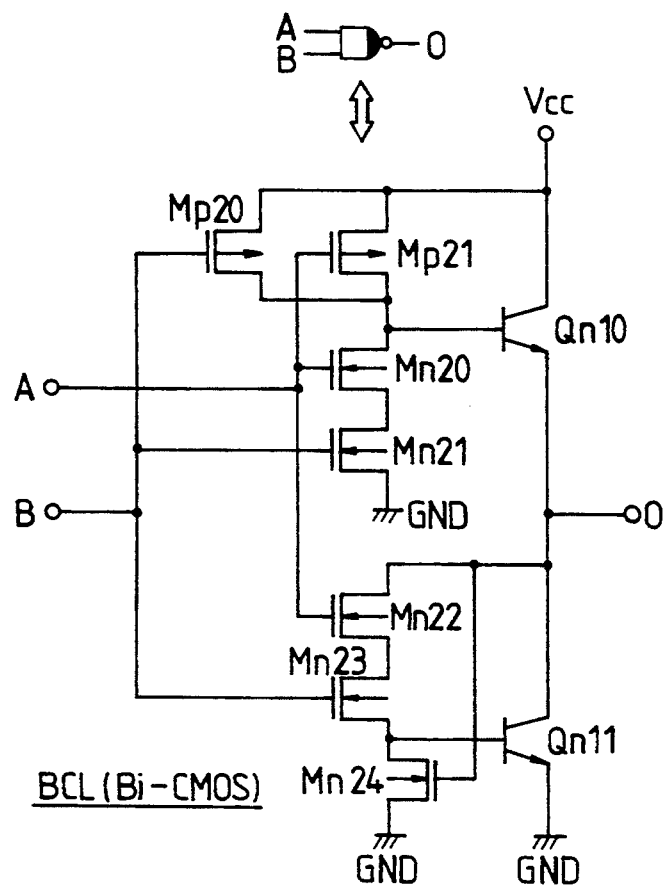
FIG. 9(B) is a specific diagram showing a BCL circuit.

FIG. 9(A) is a circuit diagram showing a portion of the aforementioned pixel data decoder (P-DEC) 6-4. The shown circuit corresponds to the column decoder for driving the aforementioned column switch selection lines Y0, Y1, Y2 and Y3, as can be understood from FIG. 9(A). Logic circuits having their output stages indicated with solid circles in FIG. 9(A) are bipolar CMOS circuits BCL. FIG. 9(B) is a circuit diagram showing the logic symbols and an equivalent circuit to a bipolar CMOS type dual-input NAND circuit composing the column decoder. As seen from FIG. 9(A), the column decoder contains twelve bipolar CMOS circuits BCL0 to BCL11. Eight bipolar CMOS circuits BCL0 to BCL8 have their inputs fed with the internal complementary address signals pd0 and $\overline{\text{pd0}}$ to pd3 and $\overline{\text{pd3}}$ coming from the address latch circuit (ADD-LATCH). Each of the bipolar CMOS circuits is composed, as shown in FIG. 9(B), of P-channel MOSFETs MP20 and MP21, N-channel MOSFETs Mn20 to Mn24, and a pair of output NPN bipolar transistors Qn10 and Qn11. The row decoder of the not-shown pixel data decoder (P-DEC) 6-4 is constructed of a bipolar CMOS circuit.

Thus, the high-speed side external circuit 6-4 has its component or circuit unit constructed of the bipolar CMOS composite type logic circuit, i.e., the BCMOS logic circuit BCL.

Figure 10A:
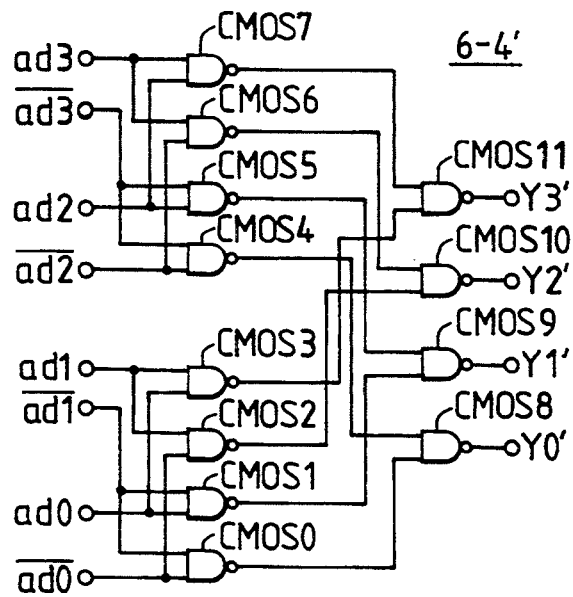
FIG. 10(A) is a diagram showing a portion of an example of the structure of a low-speed decoder 6-4' formed in the semiconductor integrated circuit device of FIG. 8.
Figure 10B:
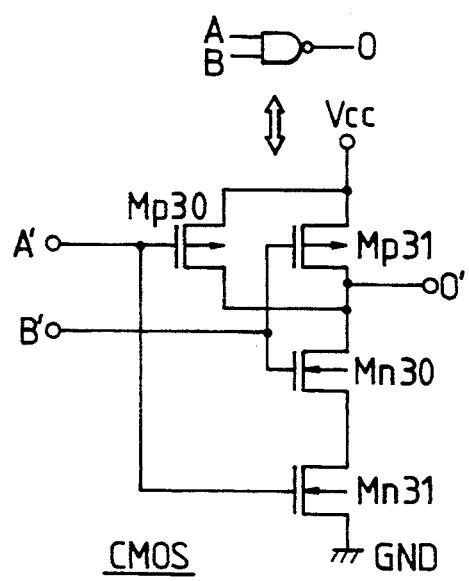
FIG. 10(B) is a specific diagram showing a CMOS circuit.

FIG. 10(A) is a circuit diagram showing a portion of the aforementioned address decoder (D-DEC) 6-4'. The shown circuit corresponds to the column decoder for driving the aforementioned column switch selection lines $\overline{\text{Y01}}$, Y1', Y2' and Y3'. This column decoder is composed of eight CMOS type NAND circuits CMOS0 to CMOS7 for receiving the internal complementary addresses ad0 and $\overline{\text{ad0}}$ to ad3 and $\overline{\text{ad3}}$, and four CMOS type dual-input NAND circuits CMOS8 to CMOS11 for receiving the outputs of the CMOS type dual-input NAND circuits CMOS0 to CMOS7. FIG. 10(B) is a circuit diagram showing the logic circuit symbols and an equivalent circuit to the CMOS type dual-input NAND circuit. Thus, this CMOS type dual-input NAND circuit is composed of P-type MOSFETs Mp30 and Mp31 and N-type MOSFETs Mn30 and Mn31. The row decoder of the not-shown address decoder (DDEC) 6-4' is also constructed of the CMOS logic circuit. Thus, the low-speed side external circuit 6-4 has its component or circuit unit constructed of a pure CMOS type logic circuit.

Figure 11:
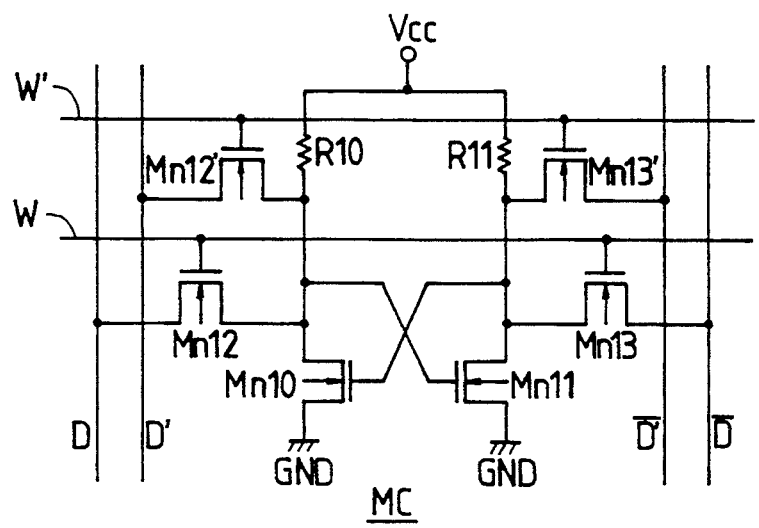
FIG. 11 is a circuit diagram showing a memory cell of FIG. 8.

FIG. 11 is a specific circuit diagram showing one of the aforementioned memory cells MC$_0$ to MC$_{255}$.

As shown, the static type memory cell MC is equipped with two sets of transfer gate MOS transistors Mn12, Mn13, Mn12' and Mn13' for one latch circuit composed of n-channel MOS transistors Mn10 and Mn11 and load resistances R10 and R11 made of polysilicon. The transfer gate MOS transistors Mn12 and Mn13, on the one hand, are turned on and off through the high-speed side word line W. The memory data are read out and written in through those transfer gate MOS transistors Mn12 and Mn13 and the high-speed side data line D. The transfer gate MOS transistors Mn12' and Mn13', on the other hand, are turned on and off through a low-speed side word line W'. The memory data are read out and written in through those transfer gate MOS transistors Mn12' and Mn13' and a low-speed data line D'. Here, the high load resistances R10 and R11 of the shown memory cell may be changed to P-channel MOSFETs. In this case, the memory cell MC is a general CMOS type static memory cell.

Figure 12:
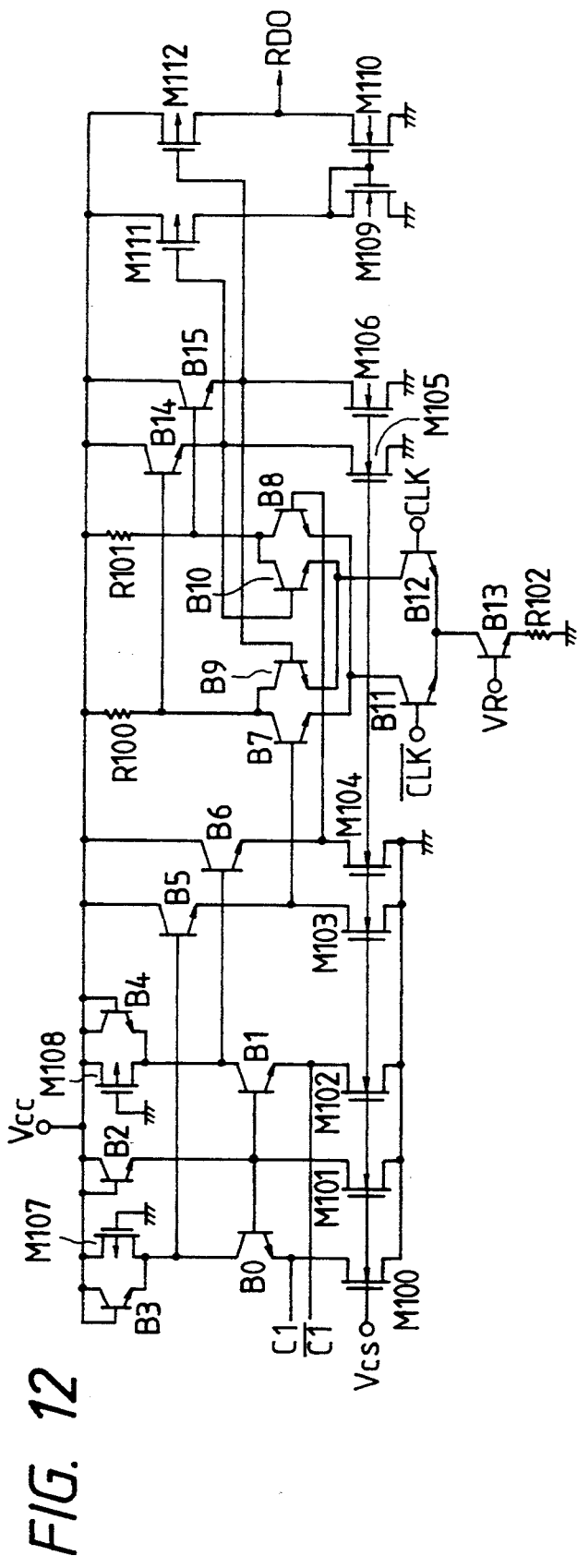
FIG. 12 is a circuit diagram showing a high-speed main amplifier MA1 of FIG. 8.
Figure 13:
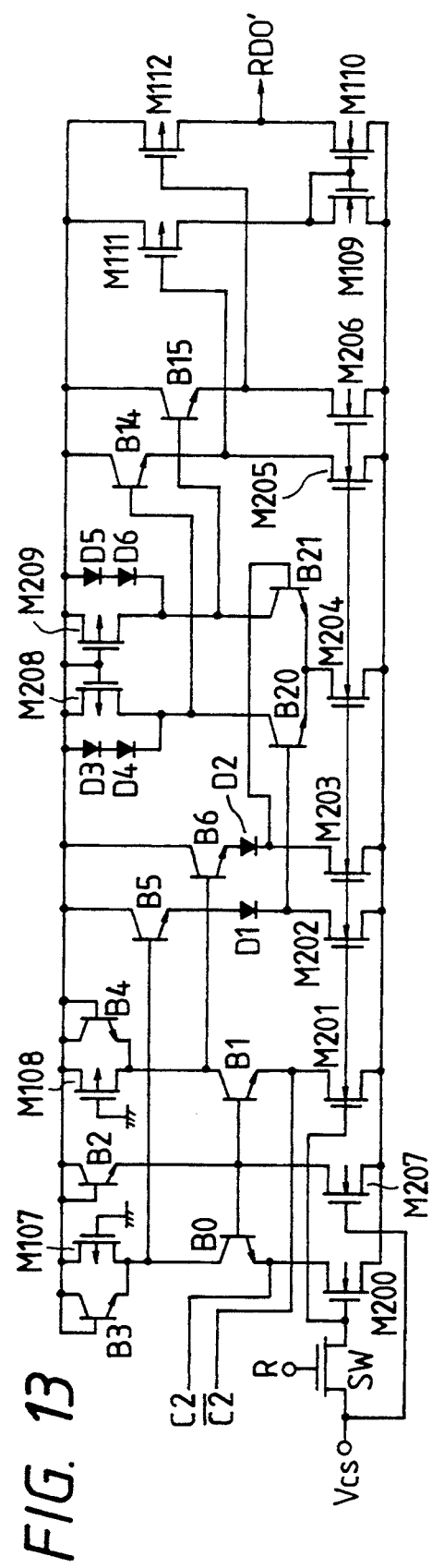
FIG. 13 is a circuit diagram showing a low-speed main amplifier MA2 of FIG. 8.

FIG. 12 shows the main amplifier MA1 of FIG. 8, and FIG. 13 shows the main amplifier MA1'.

As shown in FIG. 12, the main amplifier MA1 is composed of N-type MOSFETs M100 to M106 for a constant current source, which have their gates fed with the constant voltage Vcs. The base-grounded transistors B0 and B1 have their respective emitters connected with the collectors C1 and $\overline{\text{C1}}$ of the aforementioned differential bipolar transistors DQ1 and DQ2, to amplify the detected outputs fed from the collectors C1 and $\overline{\text{C1}}$. Between the collectors of the transistors B0 and B1 and the Vcc terminal, there are connected in parallel load MOSFETs M107 and M108 and bipolar transistors B3 and B4 which are connected in the diode form for clamping the level. Between the common base of the transistors B0 and B1 and the Vcc terminal, moreover, there is connected a diode-connected bipolar transistor B2 for clamping the potentials of the collectors $\overline{\text{C1}}$ and C1 of the differential bipolar transistors DQ1 and DQ2 at a level of $(V_{cc} - 2V_{BE})$. As a result, the saturations of the differential bipolar transistors DQ1 and DQ2 are prevented by the bias circuit BC and the bipolar transistors B0, B1 and B2. The collectors of the bipolar transistors B0 and B1 are connected with the bases of emitter-follower transistors B5 and B6, respectively. The outputs of these emitter-follower transistors B5 and B6 are inputted to a latch circuit. This latch circuit is composed of bipolar transistors B7 to B15 and resistances R100 to R102 so that it introduces the outputs of the emitter-follower transistors B5 and B6 in response to the high level of the clock signal $\overline{\text{CLK}}$ to latch the outputs of the same transistors B5 and B6. The transistors B7 and B8 are used as input transistors to feed the output signals to the bases of the emitter-follower transistors B14 and B15 when the transistor B11 is turned on by the clock signal $\overline{\text{CLK}}$. The emitter outputs of the transistors B14 and B15 are fed back to the bases of the transistors B10 and B9, respectively. After this, the transistor B11 is turned off in response to the low level of the clock $\overline{\text{CLK}}$, and the transistor B12 is turned on in response to the high level of the clock CLK, thus latching the data. Here, the transistor B13 is used a current source and has its base fed with the constant current $V_R$. The data latched by the aforementioned latch circuit is converted to the output signal from the ECL to CMOS level and to the read data RD0 by the ECL-CMOS level converter at the next stage, which is composed of the MOSFETs M109 to M112.

The main amplifier MA1' shown in FIG. 13 is composed of: a current source MOSFET M200 to M206 which are turned on only when the read signal R is at the high level; and a current source MOSFET M207 which is conductive at all times. Here, the transistors similar to the aforementioned main amplifier MA1 are designated at the identical reference characters and will not be described any more. The difference from FIG. 12 resides in that the diodes D1 and D2 are connected with the emitters of the emitter-follower transistors B5 and B6 and that a second differential sense circuit is connected with the outputs of those diodes D1 and D2. The second differential sense amplifier is composed of: differential bipolar transistors B20 and B21, diode-connected MOSFETs M208 and M209 connected between the collectors of the transistors B20 and B21 and the Vcc terminal; and level clamping diodes D3 to D6. These diodes D3 to D6 prevent saturation of the differential transistors B20 and B21 by clamping the collector potentials of the differential transistors to levels higher than their base potentials.

Figure 14:
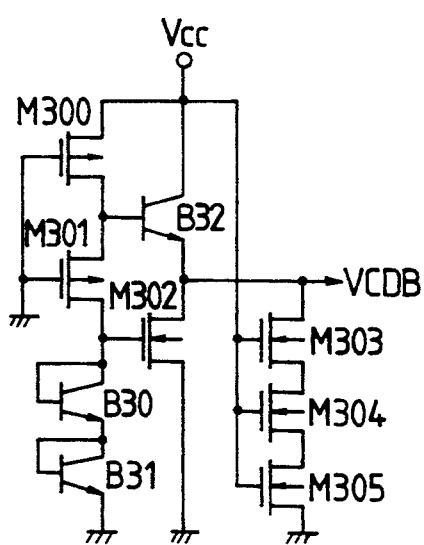
FIG. 14 is a circuit diagram showing a $CD_B$ generator.
Figure 15:
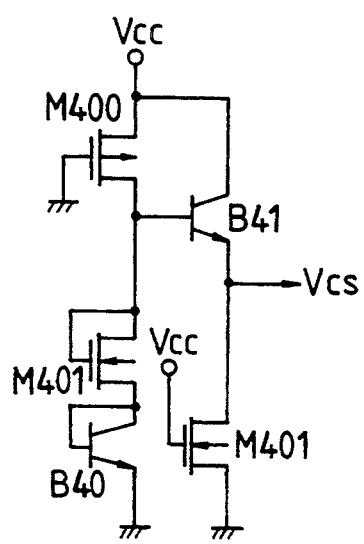
FIG. 15 is a circuit diagram showing a $V_{CS}$ generator.

FIG. 14 shows a generator for generating a common data line bias potential $V_{CDB}$ to be applied to the bias circuit BC of FIG. 8, and FIG. 15 shows a generator for generating the constant voltage Vcs for the current source.

The $V_{CDB}$ generator is composed, as shown in FIG. 14, of P-type MOSFETs M300 and M301, N-type MOSFETs M302 to M305 and bipolar transistors B30 to B32.

The Vcs generator is composed, as shown in FIG. 15, of a P-type MOSFET M400, N-type MOSFETs M401 and M402, and bipolar transistors B40 and B41. Here, the operations of the $V_{CDB}$ and Vcs generators will not be described because they could be easily understood from those skilled in the art.

Figure 16:
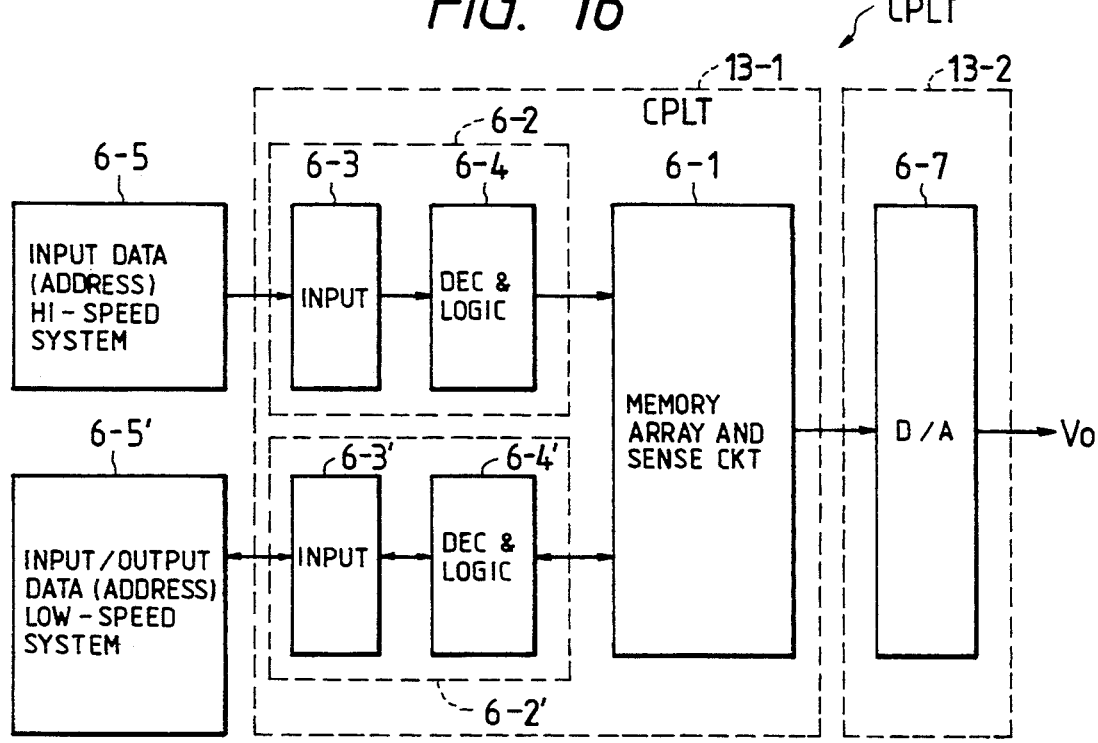
FIG. 16 is a diagram showing the schematic structure simplified from FIG. 7.

FIG. 16 is a block diagram showing FIG. 7 in a more simplified form for the sake of brevity in connection with a description thereof.

The high-speed side input circuit 6-3 is fed with the address input data (or the pixel data) from the frame buffer memory 6-5 or the like in synchronism with a high-speed reference clock. On the other hand, the low-speed side input circuit 6-3' is fed with the write data and the address from the microprocessor 6-5' in synchronism with a relatively low-speed reference clock. The memory array 6-1 is accessed in response to those two inputs. The stored data, which are read out from the memory array 6-1 by that access, i.e., the digital image signals are converted to analog image signals by the DA converter 6-7 of the analog unit 13-2. The color image can be displayed in the color CRT by the analog image signals $V_0$ thus outputted. Here, numeral 6-2 designates the high-speed external circuit, and the numeral 6-2' designates the low-speed external circuit.

Figure 17:
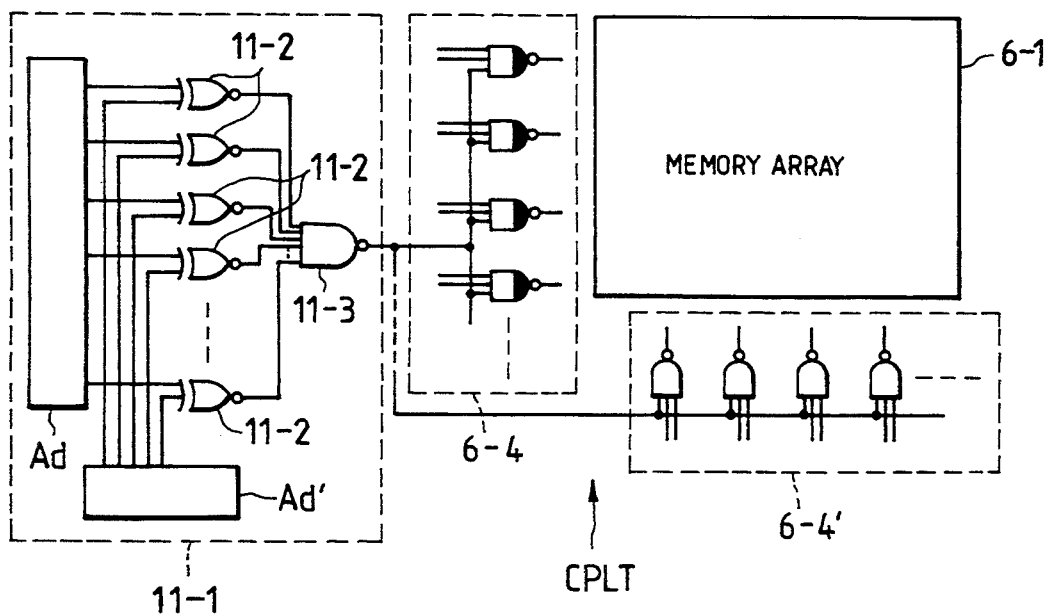
FIG. 17 is a diagram showing a schematic structure in which the color palette CPLT of the present invention is equipped with a simultaneous selection inhibition block 11-2.

FIG. 17 shows the state in which a selection inhibition circuit 11-1 is added to the aforementioned color palette CPLT. Here, the reference numerals of the address signals are different but should be understood to be identical.

When address signals Ad and Ad' are simultaneously inputted from the high- and low-speed sides, it is determined whether or not both the two addresses Ad and Ad' are those for selecting a common memory cell. If it is determined that the two addresses select the common memory cell, the selecting operations of the decoders 6-4 and 6-4' of the memory array 6-1 are inhibited.

This simultaneous selection inhibition circuit 11 is composed of: a gate 11-2 for taking an exclusive OR for each bit position between the high-speed side address Ad and the low-speed side address Ad'; and a total AND of the exclusive ORs taken for each bit position. The total logic AND output of the gate 11-3 is given as a selection inhibition signal In to the decoders 6-4 and 6-4'. These decoders 6-4 and 6-4' are inhibited from the selecting operation for the simultaneous selections by adding one logic input of the logic gate at either decoding step and by introducing the selection inhibition signal In to the added logic input.

In this case, the selection inhibition signal In may be fed to both the low- and high-speed side decoders 6-4 and 6-4'. However, the high-speed side address Ad may be preferred by feeding the selection inhibition signal In to the low-speed side decoder 6-4' only, or the low-speed side address Ad' may be preferred by feeding the same signal In to the high-speed side decoder 6-4 only.

Thanks to the simultaneous selection inhibition circuit 11-1 described above, it is possible to avoid the malfunction which might otherwise be caused by selecting the common memory cell simultaneously at the high- and low-speed sides.

Figure 18:
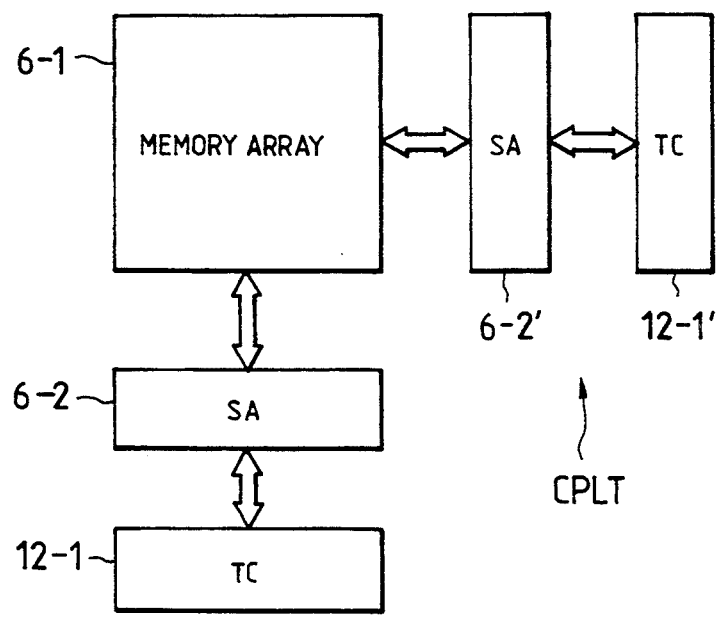
FIG. 18 is a diagram showing a schematic structure in case the color palette CPLT of the present invention is equipped with test circuits 12-1 and 12-1'.

FIG. 18 shows the structure in which test circuits 12-1 and 12-1' are built in the aforementioned color palette CPLT. The test circuits 12-1 and 12-1' are disposed independently of each other in the high-speed external circuit 6-2 and the low-speed external circuit 6-2'. The test circuit 12-1 is one for testing the operations of the high-speed side. This test circuit is constructed of a circuit structure corresponding to the high-speed operations like the Bi-CMOS logic circuit, for example. The test circuit 12-1' is one for testing the operations of the low-speed side and is constructed of a circuit structure suited for the low power consumption and the higher degree of integration like the pure CMOS logic circuit.

The operation tests at individual speeds can be properly accomplished by building the test circuits 12-1 and 12-1' separately for the operating speeds, as has been described hereinbefore. At the same time, the operation tests of the two high- and low-speed sides can be accomplished to shorten the testing periods. Since, moreover, the operation tests of the two high- and low-speed sides can be accomplished separately of each other, there can be attained another advantage that the test pattern can be simply formed.

Figure 19:
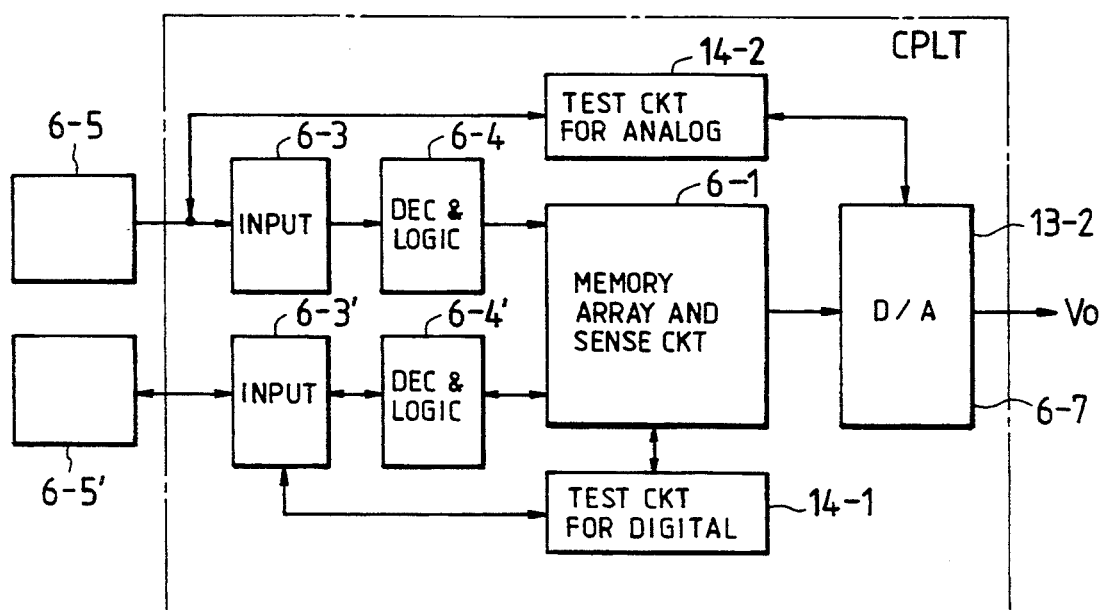
FIG. 19 is a diagram showing a schematic structure in case the color palette CPLT of the present invention is equipped with test circuits 14-2 and 14-2'.

FIG. 19 shows the case in which the aforementioned color palette CPLT is equipped with test circuits 14-1 and 14-2. In this case, these test circuits 14-1 and 14-2 are provided separately for the digital and analog portions, respectively.

The digital test circuit 14-1 tests a high- and low-speed digital portion 6-1 under the testing conditions given from the external input terminal (although not shown) through the input circuit. The analog test circuit 14-2 tests an analog portion 13-2 under the testing conditions given from the external input terminal 8 (although not shown).

By thus accomplishing the tests of the digital portion 13-1 and the analog portion 13-2 with the separate test circuits 14-1 and 14-2, like the case of the embodiment shown in FIG. 12, there can be attained effects that the test pattern can be simply formed and that the reliability can be improved by making the tests proper.

Figure 20:
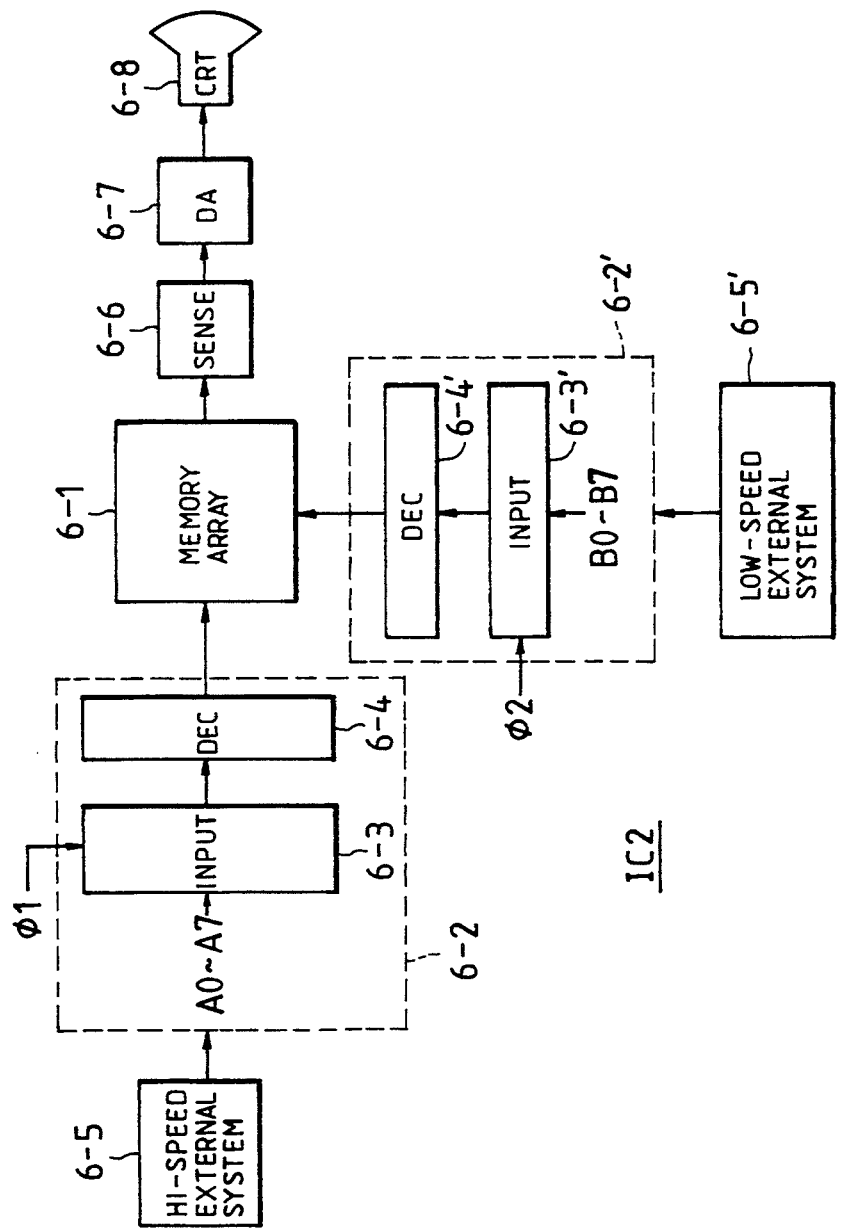
FIG. 20 is a block diagram showing a second embodiment of the present invention, in which the present invention is applied to a dual-port RAM.

FIG. 20 is a diagram showing the schematic structure of a semiconductor integrated circuit device according to a second embodiment of the present invention.

The semiconductor integrated circuit device IC2 as shown is constructed as the so-called "multi-port RAM" in which two external circuits 6-2 and 6-2' for each memory array 6-1 are formed in a common semiconductor substrate. One external circuit is constructed of the high-speed side circuit block 6-2 for receiving at its input circuit 6-3 the addresses $A_0$ to $A_7$ coming from the external system 6-5 operating at the high-speed reference clock $\phi 1$, to decode it to the selection signal by the decoder 6-4. The other external circuit 6-2' is constructed of the low-speed side circuit block for receiving at its input circuit 6-3' the addresses $B_0$ to $B_7$ coming from the external system 6-5' operating at the relatively low-speed reference clock $\phi 2$, to decode it to the selection signal by the decoder 6-4'. In FIG. 20: reference numeral 6-6 designate a sense circuit for reading out the stored information from the memory cell selected; numeral 6-7 designates a DA converter for converting the stored data read out by the sense circuit 6-6 into analog data; and numeral 6-8 designates a CRT display for displaying the analog stored data.

As has been described hereinbefore, the semiconductor integrated circuit device IC2 according to the second embodiment is characterized in that there are added to the high-speed side circuit block and the low-speed side circuit block the common circuit block (i.e., the memory array 6-1) which is to be accessed from the two circuit blocks. As a result, the coupling of the low- and high-speed side systems can be accomplished not through any external interface device but directly in the semiconductor integrated circuit device so that an efficient system can be constructed.

Here in FIG. 20, the decoder DEC 6-4 can be exemplified by the circuits shown in FIGS. 9(A) and 9(B), and the decoder DEC 6-4' can be exemplified by the circuits shown in FIGS. 10(A) and 10(B).

Although our invention has been specifically described hereinbefore in connection with the embodiments thereof, it should not be considered as being limited to those embodiments but can naturally be modified in various manners without departing from the gist thereof.

For example, the structure is modified such that there are added to the high-speed side circuit block and the low-speed side circuit block a medium-speed type circuit block having a circuit structure which will operate at an intermediate speed between those of the two circuit blocks.

In the description thus far made, our invention has been described in the case wherein it is applied to the multiport RAM for the color palette providing the background field thereof. However, the present invention should not be considered as being limited to the case but can be applied to a microprocessor or a gate array, for example.

The effects obtainable from the representative of the invention described hereinbefore will be summarized in the following.

Specifically, a plurality of circuit blocks having functions of the same kind are formed in a common semiconductor integrated circuit device and are made to have different circuit structures among the blocks. As a result, the operation requiring a high speed can be accomplished by the circuit block having a circuit structure suited for the high speed, whereas the operation not necessarily requiring the high speed can be accomplished by the circuit block having a circuit structure suited for the low power consumption and the high integration. Thus, there can be attained effects that a system or device having a plurality of speed circumstances (requirements) can be efficiently constructed and that the system or device requiring the high speed can have its structure optimized.

What is claimed is:

1. A semiconductor integrated circuit device, formed on a semiconductor substrate, to be accessed by at least one of first access means for providing first selecting signals to the semiconductor integrated circuit device and second access means for providing second selecting signals to the semiconductor integrated circuit device, the semiconductor integrated circuit device comprising:

first external terminals for receiving the first selecting signals;

second external terminals for receiving the second selecting signals;

a plurality of memory cells;

first and second word lines and first and second pairs of data lines coupled to the plurality of memory cells so that each memory cell is coupled to one of the first word lines, one of the second word lines, one pair of the first pairs of data lines, and one pair of the second pairs of data lines;

first selecting means, coupled between the first external terminals and the first word lines, and for selecting at least one of the plurality of memory cells in accordance with the first selecting signals, wherein the first selecting means operates at a first speed in conformance with the speed requirement for processing of the first selecting signals;

second selecting means, coupled between the second external terminals and the second word lines, and for selecting at least one of the plurality of memory cells in accordance with the second selecting signals, wherein the second selecting means operates at a second speed which is lower than the first speed and in conformance with the speed requirement for processing of the second selecting signals;

first sense means, coupled to the first pairs of data lines, and for subsequently amplifying a potential difference appearing between the data lines of a selected one of the first pairs of data lines in response to the selection thereof by the first selecting means; and second sense means, coupled to the second pairs of data lines, and responsive to an internal read control signal for selectively amplifying a potential difference appearing between the data lines of a selected one of the second pairs of data lines in response to the selection thereof by the second selecting means.

2. A semiconductor integrated circuit device according to claim 1, wherein the first selecting means includes first logic circuits each of which solely having an input stage formed of P-channel and N-channel MOSFETs and an output stage formed of at least one bipolar transistor.

3. A semiconductor integrated circuit device according to claim 2, wherein the second selecting means includes second logic circuits each of which consisting of only complementary MOSFETs.

4. A semiconductor integrated circuit device according to claim 3, wherein the first sense means includes a first switching MOSFET in which a gate electrode thereof is fed with a power supply voltage to maintain the first sense means activated when the device is operational, and wherein the second sense means includes a second switching MOSFET in which a gate electrode thereof is fed with a power supply voltage in response to the internal read control signal to thereby effect selective activation of the second sense means when the device is operational.

5. A semiconductor integrated circuit device according to claim 4, further comprising a plurality of pairs of first column switch MOSFETs coupled between the first pairs of data lines and the first sense means, and a plurality of pairs of second column switch MOSFETs coupled between the second pairs of data lines and the second sense means.

6. A semiconductor integrated circuit device according to claim 5, wherein selection of each pair of data lines from the first pairs of data lines is effected by selective activation of the pairs of first column switch MOSFETs by a first column selecting signal outputted from the first selecting means, and wherein selection of each pair of data lines from the second pairs of data lines is effected by selective activation of the pairs of second column switch MOSFETs by a second column selecting signal outputted from the second selecting means.

7. A semiconductor integrated circuit device according to claim 6, further comprising a write circuit coupled to selected ones of the second pairs of data lines through selected ones of the pairs of second column switch MOSFETs for inputting data into selected ones of the plurality of memory cells from the outside of the semiconductor integrated circuit device.

8. A semiconductor integrated circuit device according to claim 7, further comprising a selection inhibition means for preventing selection of a memory cell by either the first selecting means or the second selecting means when there is time-coincidence of selection commands at inputs of the first selecting means and the second selecting means.

9. A semiconductor integrated circuit device according to claim 8, wherein the first sense means has a pair of inputs coupled to the first pairs of column switch MOSFETs via a pair of first common data lines, wherein the second sense means has a pair of inputs coupled to the second pairs of column switch MOSFETs via a pair of second common data lines, and wherein the pair of first common data lines are biased at a voltage potential to allow high-speed operation by limiting the range of voltage level changes of the first pair of common data lines during reading operations.

10. A semiconductor integrated circuit device according to claim 9, wherein the first sense means includes a first pair of differentially connected bipolar transistors which have commonly coupled emitters and a high-speed amplifier circuit in series therewith, the first switching MOSFET operating as a continuously activated constant current source and being coupled between the commonly coupled emitters and reference ground, and wherein the second sense means includes a second pair of differentially connected, bipolar transistors and a low-speed amplifier circuit in series therewith, the second switching MOSFET being controllably activated as a current source in response to the internal read control signal.

11. A semiconductor integrated circuit device according to claim 10, wherein the first pair of differentially connected bipolar transistors of the first sense means are precluded from entering the saturation region of operation when in an ON-state.

12. A semiconductor integrated circuit device according to claim 1, wherein both, the first and second selecting means are comprised of row and column decoders and are performing same logic functions.

13. A semiconductor integrated circuit device according to claim 12, wherein the row and column decoders of the first and second selecting means include a plurality of NAND logic circuits, respectively, each NAND logic circuit of the first selecting means consisting of an input stage formed solely of P-channel and N-channel MOSFETs and an output stage formed solely of bipolar type transistors, and each NAND logic circuit of the second selecting means consisting solely of complementary MOSFETs.

14. A semiconductor integrated circuit device according to claim 13, wherein the first sense means includes a first switching MOSFET in which a gate electrode thereof is fed with a power supply voltage to maintain the first sense means activated when the device is operational, and wherein the second sense means includes a second switching MOSFET in which a gate electrode thereof is fed with a power supply voltage in response to the internal read control signal to thereby effect selective activation of the second sense means when the device is operational.

15. A semiconductor integrated circuit device according to claim 14, further comprising a plurality of pairs of first column switch MOSFETs coupled between the first pairs of data lines and the first sense means, and a plurality of pairs of second column switch MOSFETs coupled between the second pairs of data lines and the second sense means.

16. A semiconductor integrated circuit device according to claim 15, wherein selection of each pair of data lines from the first pairs of datalines is effected by selective activation of the pairs of first column switch MOSFETs by a first column selecting signal outputted from the first selecting means, and wherein selection of each pair of data lines from the second pairs of data lines is effected by selective activation of the pairs of second column switch MOSFETs by a second column selecting signal outputted from the second selecting means.

17. A semiconductor integrated circuit device according to claim 16, wherein the first sense means has a pair of inputs coupled to the first pairs of column switch MOSFETs via a pair of first common data lines, wherein the second sense means has a pair of inputs coupled to the second pairs of column switch MOSFETs via a pair of second common data lines, wherein the pair of first common data lines are biased at a voltage potential to allow high-speed operation by limiting the range of voltage level changes of the first pair of common data lines during reading operations, wherein the first sense means includes a first pair of differentially connected bipolar transistors which have commonly coupled emitters and a high-speed amplifier circuit in series therewith, the first switching MOSFET operating as a continuously activated constant current source and being coupled between the commonly coupled emitters and reference ground, and wherein the second sense means includes a second pair of differentially connected bipolar transistors and a low-speed amplifier circuit in series therewith, the second switching MOS- FET being controllably activated as a current source in response to the internal read control signal.

18. A semiconductor integrated circuit device according to claim 17, further comprising a selection inhibition means for preventing selection of a memory cell by either the first selecting means or the second selecting means when there is time-coincidence of selection commands at inputs of the first selecting means and the second selecting means.

19. A semiconductor integrated circuit device according to claim 13, further comprising a selection inhibition means for preventing selection of a memory cell by either the first selecting means or the second selecting means when there is time-coincidence of selection commands at inputs of the first selecting means and the second selecting means.

20. A semiconductor integrated circuit device, formed on a semiconductor substrate, comprising:
  first external terminals for receiving the first selecting signals;
  second external terminals for receiving the second selecting signals;
  a plurality of memory cells;
  first and second word lines and first and second pairs of data lines coupled to the plurality of memory cells so that each memory cell is coupled to one of the first word lines, one of the second word lines, one pair of the first pairs of data lines, and one pair of the second pairs of data lines;
  first selecting means, coupled between the first external terminals and the first word lines, and for selecting at least one of the plurality of memory cells in accordance with the first selecting signals, wherein the first selecting means operates at a first speed in conformance with the speed requirement for processing of the first selecting signals;
  second selecting means, coupled between the second external terminals and the second word lines, and for selecting at least one of the plurality of memory cells in accordance with the second selecting signals, wherein the second selecting means operates at a second speed which is lower than the first speed and in conformance with the speed requirement for processing of the second selecting signals;
  first sense means, coupled to the first pairs of data lines, and for subsequently amplifying a potential difference appearing between the data lines of a selected one of the first pairs of data lines in response to the selection thereof by the first selecting means; and
  second sense means, coupled to the second pairs of data lines, and responsive to an internal read control signal for selectively amplifying a potential difference appearing between the data lines of a selected one of the second pairs of data lines in response to the selection thereof by the second selecting means.

21. A semiconductor integrated circuit device according to claim 20, wherein the first selecting means includes first logic circuits each of which solely having an input stage formed of P-channel and H-channel MOSFETs and an output stage formed of at least one bipolar transistor, and wherein the second selecting means includes second logic circuits each of which consisting of only complementary MOSFETs.

22. A semiconductor integrated circuit device according to claim 21, wherein the first sense means includes a first switching MOSFET in which a gate electrode thereof is fed with a power supply voltage to maintain the first sense means activated when the device is operational, and wherein the second sense means includes a second switching MOSFET in which a gate electrode thereof is fed with a power supply voltage in response to the internal read control signal to thereby effect selective activation of the second sense means when the device is operational.

23. A semiconductor integrated circuit device according to claims 22, further comprising a plurality of pairs of first column switch MOSFETs coupled between the first pairs of data lines and the first sense means, and a plurality of pairs of second column switch MOSFETs coupled between the second pairs of data lines and the second sense means,
  wherein selection of each pair of data lines from the first pairs of data lines is effected by selective activation of the pairs of first column switch MOSFETs by a first column selecting signal outputted from the first selecting means, and wherein selection of each pair of data lines from the second pairs of data lines is effected by selective activation of the pairs of second column switch MOSFETs by a second column selecting signal outputted from the second selecting means.

24. A semiconductor integrated circuit device according to claim 23, further comprising a write circuit coupled to selected ones of the second pairs of data lines through selected ones of the pairs of second column switch MOSFETs for inputting data into selected ones of the plurality of memory cells from the outside of the semiconductor integrated circuit device.

25. A semiconductor integrated circuit device according to claim 24, further comprising a selection inhibition means for preventing selection of a memory cell by either the first selecting means or the second selecting means when there is time-coincidence of selection commands at inputs of the first selecting means and the second selecting means.

26. A semiconductor integrated circuit device according to claims 20, wherein both the first and second selecting means are comprised of row and column decoders and are performing same logic functions.

27. A semiconductor integrated circuit device according to claim 26, wherein the row and column decoders of the first and second selecting means include a plurality of NAND logic circuits, respectively, each NAND logic circuit of the first selecting means consisting of an input stage formed solely of P-channel and N-channel MOSFETs and an output stage formed solely of bipolar type transistors, and each NAND logic circuit of the second selecting means consisting solely of complementary MOSFETs.

28. A semiconductor integrated circuit device according to claim 27, wherein the first sense means includes a first switching MOSFET in which a gate electrode thereof is fed with a power supply voltage to maintain the first sense means activated when the device is operational, and wherein the Second sense means includes a second switching MOSFET in which a gate electrode thereof is fed with a power supply voltage in response to the internal read control signal to thereby effect selective activation of the second sense means when the device is operational.

29. A semiconductor integrated circuit device according to claim 28, further comprising a plurality of pairs of first column switch MOSFETs coupled between the first pairs of data lines and the first sense means, and a plurality of pairs of second column switch MOSFETs coupled between the second pairs of data lines and the second sense means, wherein selection of each pair of data lines from the first pairs of data lines is effected by selective activation of the pairs of first column switch MOSFETs by a first column selecting signal outputted from the first selecting means, and wherein selection of each pair of data lines from the second pairs of data lines is effected by selective activation of the pairs of second column switch MOSFETs by a second column selecting signal outputted from the second selecting means.

30. A semiconductor integrated circuit device according to claim 29, wherein the first sense means has a pair of inputs coupled to the first pairs of column switch MOSFETs via a pair of first common data lines, wherein the second sense means has a pair of inputs coupled to the second pairs of column switch MOSFETs via a pair of second common data lines, wherein the pair of first common data lines are biased at a voltage potential to allow high-speed operation by limiting the range of voltage level changes of the first pair of common data lines during reading operations, wherein the first sense means includes a first pair of differentially connected bipolar transistors which have commonly coupled emitters and a high-speed amplifier circuit in series therewith, the first switching MOSFET operating as a continuously activated constant current source and being coupled between the commonly coupled emitters and reference ground, and wherein the second sense means includes a second pair of differentially connected bipolar transistors and a low-speed amplifier circuit in series therewith, the second switching MOSFET being controllably activated as a current source in response to the internal read control signal.

31. A semiconductor integrated circuit device according to claim 30, further comprising a selection inhibition means for preventing selection of a memory cell by either the first selecting means or the second selecting means when there is time-coincidence of selection commands at inputs of the first selecting means and the second selecting means.

* * * * *